(12) United States Patent
Yagihara et al.

(10) Patent No.: US 11,230,871 B2
(45) Date of Patent: Jan. 25, 2022

(54) OPENING/CLOSING BODY CONTROL DEVICE

(71) Applicant: Valeo Japan Co., Ltd., Saitama (JP)

(72) Inventors: Toaki Yagihara, Tokyo (JP); Kenji Amimoto, Tokyo (JP)

(73) Assignee: Valeo Japan Co., Ltd.

( * ) Notice: Subject to any disclaimer, the term of this patent is extended or adjusted under 35 U.S.C. 154(b) by 208 days.

(21) Appl. No.: 16/724,153

(22) Filed: Dec. 20, 2019

(65) Prior Publication Data
US 2020/0199927 A1    Jun. 25, 2020

(30) Foreign Application Priority Data

Dec. 21, 2018  (JP) .............................. JP2018-239954

(51) Int. Cl.
| | |
|---|---|
| *E05F 15/40* | (2015.01) |
| *E05F 15/60* | (2015.01) |
| *H03K 17/687* | (2006.01) |
| *B60J 1/17* | (2006.01) |

(52) U.S. Cl.
CPC .............. *E05F 15/40* (2015.01); *E05F 15/60* (2015.01); *H03K 17/6871* (2013.01); *B60J 1/17* (2013.01); *E05Y 2201/434* (2013.01); *E05Y 2400/65* (2013.01); *E05Y 2900/55* (2013.01)

(58) Field of Classification Search
CPC . B60J 1/17; E05F 15/40; E05F 15/659; E05Y 2800/428; H03K 17/6871
See application file for complete search history.

(56) References Cited

U.S. PATENT DOCUMENTS

| | | | | |
|---|---|---|---|---|
| 6,690,096 | B2* | 2/2004 | Sasaki | E05F 15/695 307/10.1 |
| 2018/0370466 | A1* | 12/2018 | Murata | G05B 9/02 |
| 2019/0081365 | A1* | 3/2019 | Yamamoto | H05K 1/18 |
| 2020/0130622 | A1* | 4/2020 | Lerner | B60K 35/00 |

FOREIGN PATENT DOCUMENTS

JP          2001-20601 A      1/2001

OTHER PUBLICATIONS

English abstract for JP-2001-20601.

* cited by examiner

*Primary Examiner* — Rexford N Barnie
*Assistant Examiner* — Elim Ortiz
(74) *Attorney, Agent, or Firm* — Fishman Stewart PLLC

(57) ABSTRACT

An opening/closing body control device may include an actuator, a drive device configured to drive the actuator configured to at least one of open and close an opening/closing body of a vehicle, an operation switch, and a signal output device. The signal output device may be configured to drive the actuator via outputting a signal to the drive device when the operation switch is operated. The signal output device may include a signal line, a submergence detection circuit configured to detect submergence of the vehicle in water, a switch, and a pullup resistance connected via the switch to a power source. The switch may be configured to turn on when submergence of the vehicle in water is detected and the operation switch is not operated. The pullup resistance may be connected electrically to the signal line when the switch turns on to output a signal to the drive device.

3 Claims, 3 Drawing Sheets

<At a normal time>

| Operation Switch SW1 | Transistor 93 | Transistor 55 | MOSFET 56 | Output |
|---|---|---|---|---|
| OFF | OFF | OFF | OFF | OPEN |
| ON | OFF | OFF | OFF | Lo |

<At submerging>

| Operation Switch SW1 | Transistor 93 | Transistor 55 | MOSFET 56 | Output |
|---|---|---|---|---|
| OFF | ON | ON | ON | Hi |
| ON | ON | OFF | OFF | Lo |

FIG. 2

OPENING/CLOSING BODY CONTROL DEVICE

CROSS-REFERENCE TO RELATED APPLICATION

This application claims priority under 35 USC 119 from Japanese Patent Application No. JP 2018-239954 filed on Dec. 21, 2018, the disclosure of which is incorporated by reference herein.

TECHNICAL FIELD

The present invention relates to an opening/closing body control device.

BACKGROUND

A power window device drives a window glass of a side door or the like in a vehicle by an actuator of a motor or the like for up-and-down movement. The power window device is provided with an operation switch for a user to instruct an up-and-down movement of a window, a drive device for driving the window, and a signal output device for outputting a signal to the drive device in response to an operation of the operation switch. The signal output device inputs a signal of a low-voltage level below a predetermined value to the drive device when the operation switch is operated, for example.

However, in a case where a vehicle is submerged in water due to accidents, disasters or the like, a conductive part including a welding portion of a circuit component in the signal output device gets wet with water, and therefore, in some cases the signal to be outputted to the drive device is lowered to a low-voltage level. In this case, although the user does not operate the operation switch, the signal of the low-voltage level is outputted to the drive device, possibly creating an erroneous operation of the window. For preventing the erroneous operation of the window, there is made a proposal that an insulating epoxy resin with excellent water resistance is filled in an inner part of a case accommodating the circuit component in the power window device to mold the circuit component inside of the case (for example, refer to Japanese Patent Laid-Open No. 2001-20601 A).

However, a manufacturing cost of the device increases by filling the epoxy resin into the inside of the case. For suppressing the manufacturing cost, a proposal of applying waterproof coating onto the circuit component is also made. There are some cases where even when the waterproof coating is applied onto the circuit component, the waterproof performance is not sufficient as the waterproof to the circuit configuration. The power window device is required to ensure a time for up-and-down movement of the window in response to the operation of the user by preventing the erroneous operation of the window even when the device is submerged in water.

SUMMARY

The present invention is made in view of the foregoing problems in the conventional technology, and an object of the present invention is to provide an opening/closing body control device that can prevent an erroneous operation of an opening/closing body when a vehicle is submerged in water and ensure a time for operating the opening/closing body in response to an operation of an operation switch by a user.

According to an aspect of the present invention, an opening/closing body control device comprises:

an actuator that opens/closes an opening/closing body of a vehicle;

a drive device that drives the actuator;

an operation switch that is operated at the opening/closing of the opening/closing body; and a signal output device that drives the actuator by outputting a signal of a voltage level below a threshold value to the drive device when the operation switch is operated, wherein the signal output device includes:

a signal line that connects the operation switch and the drive device to output the signal to the drive device in response to the operation of the operation switch;

a submergence detection circuit that detects submergence of the vehicle in water;

a switch that turns on in a case where the submergence of the vehicle in water is detected and the operation switch is not operated; and a pullup resistance that is connected via the switch to a power source, the pullup resistance being connected electrically to the signal line when the switch turns on to output a signal a voltage level of which is equal to or more than a threshold value to the drive device.

According to the aspect of the present invention, at the submerging of the vehicle in water the erroneous operation of the opening/closing body can be prevented to ensure the time for operating the opening/closing body in response to the operation of the operation switch by the user, thus making it possible to improve safety of the vehicle.

BRIEF DESCRIPTION OF THE DRAWINGS

Other objects, features, and advantages of the present invention will become more apparent from the following detailed description made with reference to the accompanying drawings, in which like parts are designated by like reference numbers and in which:

FIG. 2 is tables showing an operation of each of elements in an output circuit at a normal time and at a submerged time of a vehicle each;

DETAILED DESCRIPTION

First Embodiment

Hereinafter, an explanation will be made of an embodiment of the present invention with reference to the accompanying drawings.

In the embodiment, an explanation will be made of an example where an opening/closing body control device according to the embodiment of the present invention is applied to a power window device that controls opening/closing of a window located in a side door or the like of a vehicle.

Figure 1:
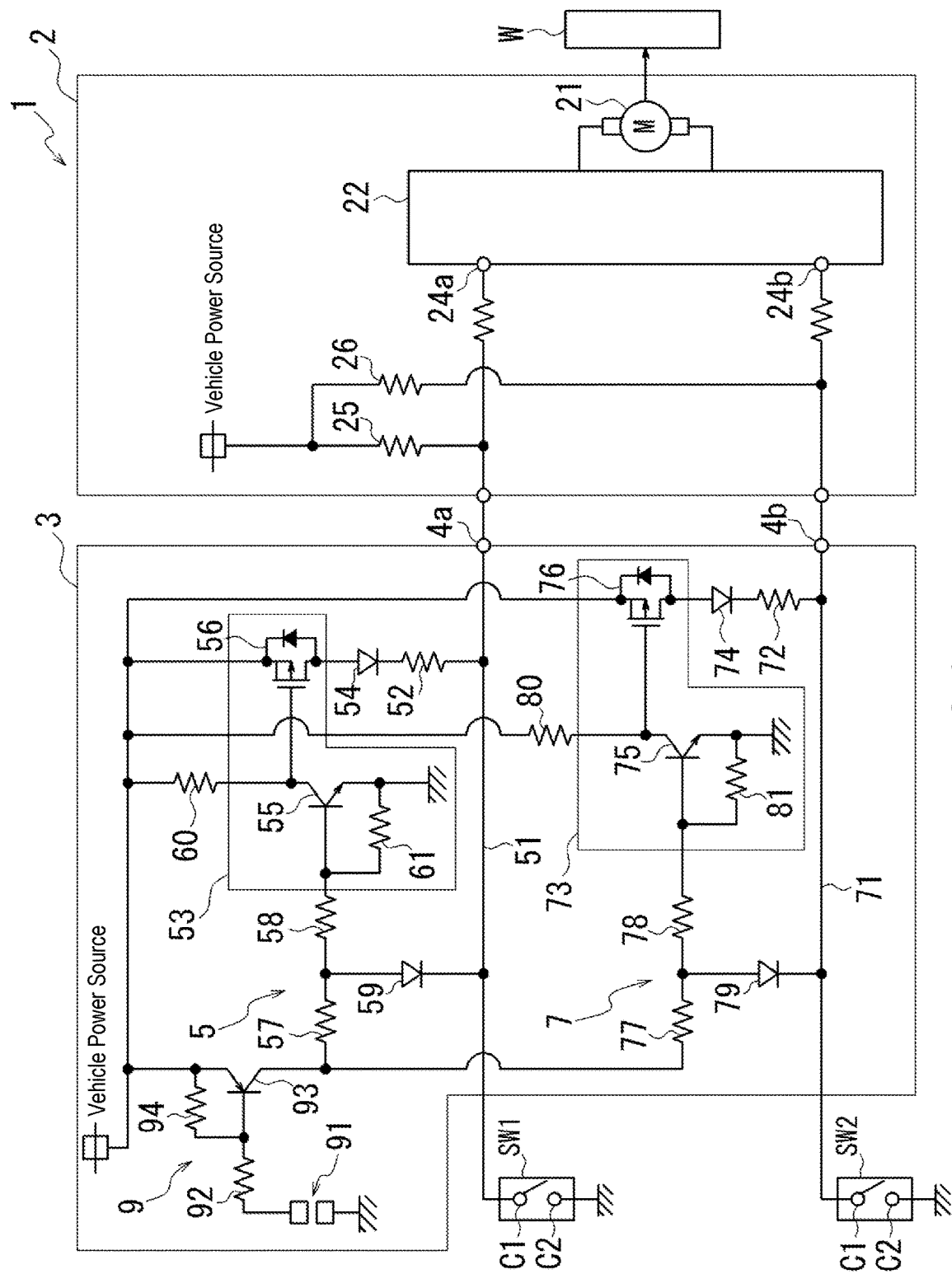
FIG. 1 is a diagram showing a configuration of a power window device according to an embodiment of the present invention.

FIG. 1 is a diagram showing a configuration of a power window device according to the embodiment.

The power window device 1 is configured to control opening/closing of a window W located in the side door or the like in the vehicle, and, as shown in FIG. 1, is provided with operation switches SW1, SW2 that are operated by a user, a drive device 2 that opens/closes the window W by elevating the window W, and a signal output device 3 that outputs a signal to the drive device 2 in response to the operation of each of the operation switches SW1, SW2 by the user.

The operation switches SW1, SW2 are provided for the user to operate the elevation of the window W, and, for example, the operation switch SW1 for moving-up and the operation switch SW2 for moving-down are respectively located on the side door of the vehicle.

The operation switches SW1, SW2 each may adopt a switch provided with two openable/closable contact points C1, C2 as an example. The operation switches SW1, SW2 each are connected at the contact point C1-side to the signal output device 3 and grounded at the contact point C2-side. When the user operates the operation switches SW1, SW2, the contact points C1, C2 become in a closed state to cause the operation switches SW1, Sw2 to turn on, and in a state where the user does not operate the operation switches SW1, SW2, the contact points C1, C2 become in an open state to cause the operation switches SW1, SW2 to turn off.

The drive device 2 is provided with a motor 21 for elevating the window W, and a drive control circuit 22 for driving the motor 21.

The drive control circuit 22 is provided with input terminals 24a, 24b, which are connected to the signal lines 51, 71 for inputting signals from the signal output device 3 to the input terminals 24a, 24b. When the operation switch SW1 is operated, a signal is input to the drive control circuit 22 via the input terminal 24a from the signal line 51, and when the operation switch SW2 is operated, a signal is input to the drive control circuit 22 via the input terminal 24b from the signal line 71. Although omitted in illustration, the input terminals 24a, 24b of the drive control circuit 22 respectively are provided with voltage sensors. The drive control circuit 22 determines a voltage level to be input to each of the input terminals 24a, 24b, and thereby, an up-movement instruction or a down-movement instruction of the window W is outputted to the drive control circuit 22.

The drive device 2 is provided with pullup resistances 25, 26 connected to the signal lines 51, 71 respectively. The pullup resistances 25, 26 are connected at an input side to a vehicle power source, and at an output side to the signal lines 51, 71 respectively. The vehicle power source is not limited to a specific type, but may be an ignition switch, for example, or a battery.

The signal output device 3 is provided with a first circuit 5 that outputs a signal to the drive device 2 in response to an operation of the operation switch SW1, and a second circuit 7 that outputs a signal to the drive device 2 in response to an operation of the operation switch SW2. Hereinafter, at the time of collectively referring to the first circuit 5 and the second circuit 7, the first circuit 5 and the second circuit 7 are simply referred to as "circuits 5, 7" as well. The signal output device 3 is also provided with a submergence detection circuit 9 that is connected to each of the circuits 5, 7 and detects submergence of the vehicle in water.

The submergence detection circuit 9 is provided with a submergence sensor 91 that detects submergence of the vehicle in water, and a pnp transistor 93 connected via a resistance 92 to the submergence sensor 91.

The submergence sensor 91 may be configured of electrodes at two locations that are arranged to oppose to each other on a substrate, for example. When the electrodes are wet with water by the submergence of the vehicle in water, a leak current is generated between the electrodes, and power supply is established by the leak current to detect the submergence of the vehicle in water.

The place of locating the submergence sensor 91 is not limited, but the place where the submergence sensor 91 gets wet because of raining at a normal time may be avoided and the submergence sensor 91 may be located in the place where the submergence sensor 91 is accommodated in a case or the like, and gets wet when the entire vehicle is submerged in water.

The transistor 93 has a base side that is connected via the resistance 92 to the submergence sensor 91 and an emitter side that is connected to the vehicle power source. A collector side of the transistor 93 is connected to each of the circuits 5, 7. A resistance 94 is connected between the emitter and the base of the transistor 93. When the leak current flows to the submergence sensor 91, a voltage is applied to the base of the transistor 93 to cause the transistor 93 to turn on, establishing the supply power between the collector and the emitter.

The first circuit 5 is provided with the signal line 51, a pullup resistance 52 connected to the signal line 51, and a switch 53 that switches electrical connection and disconnection between the signal line 51 and the pullup resistance 52.

The signal line 51 has one end side that is connected to the contact point C1-side of the operation switch SW1 and the other end side that is connected via an output terminal 4a of the signal output device 3 to the input terminal 24a of the drive control circuit 22 in the drive device 2.

The pull up resistance 52 has one end side that is connected between the operation switch SW1 and the output terminal 4a of the signal line 51 and the other end side that is connected via a diode 54 and the switch 53 to the vehicle power source.

The switch 53 is configured of a MOSFET (metal-oxide-semiconductor field-effect transistor) 56, and an npn transistor 55 that drives the MOSFET 56. The transistor 55 has a base side that is connected via two resistors 57, 58 to the collector side of the transistor 93 in the submergence detection circuit 9. The operation switch SW1 is connected to connection between the transistor 93 and the transistor 55.

Specifically the contact point C1 of the operation switch SW1 is connected via a diode 59 between the two resistances 57, 58.

The signal line 51 is connected between the diode 59 and the contact point C1 of the operation switch SW1. The transistor 55 has a collector side that is connected via a resistance 60 to the vehicle power source and an emitter side that is grounded. A resistance 61 is connected between the emitter and the base of the transistor 55.

The MOSFET 56 has a gate side that is connected between the collector side of the transistor 55 and the vehicle power source, a source side that is connected to the vehicle power source, and a drain side that is connected via the diode 54 to the pull up resistance 52.

With this configuration, the transistor 55 and the MOSFET 56 in the switch 53 each turn on in a case where the transistor 93 in the submergence detection circuit 9 turns on due to the submergence and the operation switch SW1 turns off, thus electrically connecting the pull up resistance 52 to the signal line 51.

The second circuit 7 has the same configuration as the first circuit 5, and is provided with the signal line 71, a pullup resistance 72 connected to the signal line 71, and a switch 73 that switches electrical connection and disconnection between the signal line 71 and the pullup resistance 72.

The signal line 71 has one end side that is connected to the contact point C1-side of the operation switch SW2 and the other end side that is connected via an output terminal 4b of the signal output device 3 to an input terminal 24b of the drive control circuit 22 in the drive device 2.

The switch 73 is configured of a MOSFET 76, and an npn transistor 75 that drives the MOSFET 76. The transistor 75 has a base side that is connected via two resistors 77, 78 to the collector side of the transistor 93 in the submergence detection circuit 9, a collector side that is connected via a resistance 80 to the vehicle power source, and an emitter side that is grounded. A resistance 81 is connected between the emitter and the base of the transistor 75. The contact point C1 of the operation switch SW2 is connected via a diode 79 between the resistances 77, 78. That is, the operation switch SW2 is connected to connection between the transistor 93 in the submergence detection circuit 9 and the transistor 75.

The signal line 71 is connected between the diode 79 and the contact point C1 of the operation switch SW2. The transistor 75 has a collector side that is connected via the resistance 80 to the vehicle power source and an emitter side that is grounded. The resistance 81 is connected between the emitter and the base of the transistor 75.

The MOSFET 76 has a gate side that is connected to the collector side of the transistor 75, a source side that is connected to the vehicle power source, and a drain side that is connected via a diode 74 to the pull up resistance 72.

With this configuration, the transistor 75 and the MOSFET 76 in the switch 73 each turn on in a case where the transistor 93 in the submergence detection circuit 9 turns on due to the submergence of the vehicle in water and the operation switch SW2 turns off, thus electrically connecting the pullup resistance 72 to the signal line 71.

An explanation will be made of the operation of the power window device 1 configured as described above.

The drive control circuit 22 in the drive device 2 determines whether the operation switch SW1 or the operation switch SW2 is operated by determining a voltage level to be input to each of the input terminals 24a, 24b. In a case where the drove control circuit 22 determines that the operation switch SW1 or the operation switch SW2 is operated, the drive control circuit 22 drives the motor 21 to move up or down the window W.

In the embodiment, the drive control circuit 22 performs a low active control. When the drive control circuit 22 determines that a voltage level of a signal to be input to each of the input terminals 24a, 24b is equal to or more than a threshold value TH, the drive control circuit 22 determines that the operation switch SW1 and the operation switch SW2 both are not operated to stop the motor 21 and set the window W to be in a non-elevating state. The threshold value TH is in advance set.

In a case where the voltage level of the input terminal 24a is below the threshold value TH and the voltage level of the input terminal 24b is equal to or more than the threshold value TH, the drive control circuit 22 determines that the operation switch SW1 is operated to drive the motor 21 and move up the window W.

In a case where the voltage level of the input terminal 24a is equal to or more than the threshold value TH and the voltage level of the input terminal 24b is below the threshold value TH, the drive control circuit 22 determines that the operation switch SW2 is operated to drive the motor 21 and move down the window W.

The signal output device 3 outputs a signal of a voltage level below the threshold value TH (hereinafter, referred to as "Lo signal") from the output terminal 4a or the output terminal 4b when the operation switch SW1 or the operation switch SW2 is operated, thereby changing the voltage level to be input to the input terminal 24a or the input terminal 24b of the drive control circuit 22 to the threshold value TH or less to elevate the window W.

A specific operation of the signal output device 3 will be explained at the normal time and at the submerging of the vehicle in water separately.

FIG. 2 is tables showing an operation of each of the elements in the first circuit 5 at the normal time and at the submerging of the vehicle in water respectively.

FIG. 2 shows an operation of each of the elements in the first circuit 5 in response to an operation of the operation switch SW1 at the normal time and at the submerging of the vehicle in water each.

It should be noted that although omitted in illustration, each of elements in the second circuit 7 operates in response to an operation of the operation switch SW2 in the same way as in the first circuit 5.

As shown in FIG. 2, since the leak current does not flow in the submergence sensor 91 at the normal time, the transistor 93 in the submergence detection circuit 9 turns off. Therefore, both the transistor 55 and the MOSFET 56 in the switch 53 turn off in the first circuit 5 regardless of the operation of the operation switch SW1, and the pullup resistance 52 is electrically disconnected to the signal line 51.

In a case where the operation switch SW1 turns off at the normal time, since the contact points C1, C2 are in an open state, the Lo signal is not input to the drive control circuit 22 in the drive device 2 from the signal output device 3, and as shown in FIG. 2, the first circuit 5 is open to the drive device 2.

On the other hand, as shown in FIG. 1, the pullup resistances 25, 26 provided in the drive device 2-side are connected to the signal line 51. Therefore, a signal (hereinafter, referred to as "Hi signal") equal to or more than the threshold value TH pulled up by the vehicle power source via the pullup resistance 25 is input to the input terminal 24a of the drive device 2. As a result, the drive control device 22 determines that the operation switch SW1 is not operated.

In a case where the operation switch SW1 is operated to cause the contact points C1, C2 to be in a closed state, since the contact point C2 is grounded and the output terminal 24a becomes to the GND level, the Lo signal is input to the input terminal 24a of the drive control circuit 22. Thereby, the drive control device 22 determines that the operation switch SW1 is operated.

As similar to the first circuit 5 described above, at the normal time, the transistor 75 and the MOSFET 76 in the switch 73 turn off in the second circuit 7, and the pullup resistance 72 is electrically disconnected to the signal line 71.

In a case where the operation switch SW2 turns off, since the Hi signal pulled up by the vehicle power source is input via the pull up resistance 26 to the input terminal 24b of the drive device 2, the drive control circuit 22 determines that the operation switch Sw2 is not operated. When the operation switch SW2 is operated, since the output terminal 4b becomes to the GND level, the Lo signal is input to the input terminal 24b of the drive control circuit 22, and the drive control circuit 22 determines that the operation switch SW2 is operated.

Next, an explanation will be made of an operation of the signal output device 3 in the embodiment at the submerging of the vehicle in water in contrast to comparative examples 1 and 2.

Figure 3:
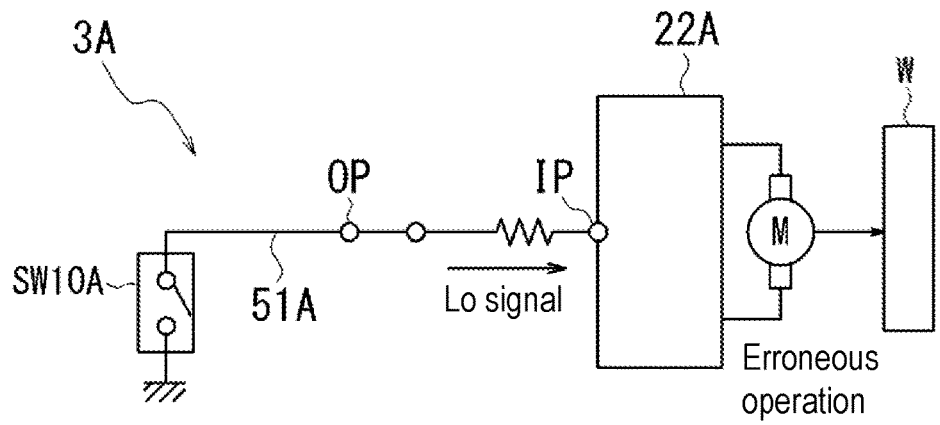
FIG. 3 is a diagram showing an output circuit in a comparative example 1.

FIG. 3 is a diagram showing a comparative example 1.

Figure 4:
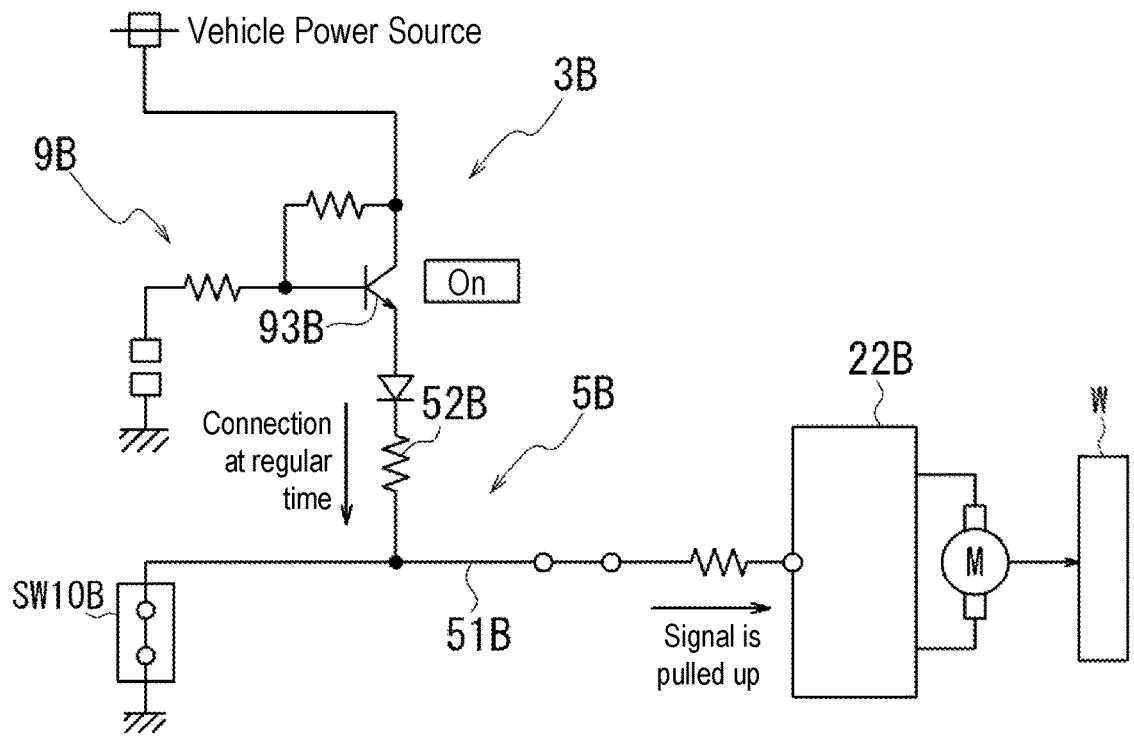
FIG. 4 is a diagram showing an output circuit in a comparative example 2.

FIG. 4 is a diagram showing a comparative example 2.

For distinguishing from the configuration in the embodiment, the comparative example 1 is shown by attaching "A" to the end of the numeral and the comparative example 2 is shown by attaching "B" to the end of the numeral. It should be noted that FIG. 3 and FIG. 4 are simplified diagrams, and FIG. 3 shows only the configuration that a single operation switch SW10A is connected to a drive control circuit 22A, and FIG. 4 shows only the configuration that a single operation switch SW10B is connected to a drive control circuit 22B. The comparative example 1 in FIG. 3 shows the configuration that a signal output device 3A is not provided with a submergence detection circuit, a switch and a pullup resistance. The comparative example 2 in FIG. 4 shows the configuration that a signal output device 3B is not provided with a switch, and a pullup resistance 52B is connected directly between a submergence detection circuit and an operation switch SW10B.

When the vehicle is submerged in water, the contact point of the operation switch SW10A possibly gets wet with the water to generate the leak current.

In this case, in the comparative example 1 in FIG. 3, which is different from the present embodiment, the pullup resistance is not connected to a signal line 51A. Therefore, an output terminal OP becomes to the GND (the low voltage) level regardless of no operation of the operation switch SW10A, and an Lo signal is input to an input terminal IP of the drive control circuit 22A. In this case, since the drive control circuit 22 determines that the operation switch SW10A is operated, the drive control circuit 22 possibly elevates the window erroneously.

On the other hand, as shown in FIG. 2, in the embodiment when the vehicle is submerged in water, the leak current flows in the submergence sensor 91 of the submergence detection circuit 9, thereby turning on the transistor 93.

In a case where the operation switch SW1 turns off, since the contact points C1, C2 are in the open state, the current that has flowed from the vehicle power source to the transistor 93 flows to the transistor 55 in the first circuit 5. The transistor 55 turns on by an application of the voltage to the base to establish power supply between the collector and the emitter. Thereby, since the voltage is applied from the vehicle power source to the gate side of the MOSFET 56 connected to the collect side of the transistor 55, the MOSFET 56 turns on to establish the power supply between the source and the drain.

As a result, the pullup resistance 52 is connected electrically to the signal line 51. Even in a case where the leak current is generated in the operation switch SW1, since the output terminal 4a is pulled up via the pullup resistance 52 by the vehicle power source, a signal to be input to the input terminal 24a of the drive device 2 is maintained to an Hi signal. Thereby, the drive control circuit 22 determines that the operation switch SW1 is not operated.

On the other hand, in FIG. 1 in a case where the operation switch SW1 is operated to turn on at the submerging of the vehicle in water, since the contact points C1, C2 are in the closed state, the current that has flowed from the vehicle power source to the transistor 93 flows to the operation switch SW1-side. Thereby, since the current does not flow in the switch 53, the transistor 55 and the MOSFET 56 turn off, and the pullup resistance 52 is disconnected electrically to the signal line 51. Since the contact point C2 of the operation switch SW1 is grounded, the output terminal 4a becomes to the GND level, and the Lo signal is input to the input terminal 24a of the drive control circuit 22. Thereby, the drive control circuit 22 determines that the operation switch SW1 is operated.

As similar in the second circuit 7 as well, in a case where the operation switch SW2 is not operated at the submerging of the vehicle in water, the transistor 75 and the MOSFET 76 in the switch 73 turn on to connect the pullup resistance 72 electrically to the signal line 71, thereby maintaining the signal to be input to the input terminal 24b of the drive control circuit 22 to the Hi signal. Thereby, the drive control circuit 22 determines that the operation switch SW2 is not operated. On the other hand, in a case where the operation switch SW2 is operated, the transistor 75 and the MOSFET 76 in the switch 73 turn off to disconnect the pullup resistance 72 electrically to the signal line 71, and the Lo signal is input to the input terminal 24b of the drive control circuit 22. Thereby, the drive control circuit 22 determines that the operation switch SW2 is operated.

In this way, in the embodiment the operation switch SW1 is connected to the connection between the submergence detection switch 9 and the switch 53, and the operation switch SW2 is connected to the connection between the submergence detection switch 9 and the switch 73. Therefore, at the submerging of the vehicle in water, electrical connection and disconnection of the pullup resistances 52, 57 to the signals lines 51, 71 can be switched in response to operation states of the operation switches SW1, SW2.

On the other hand, in the comparative example 2 shown in FIG. 4, the pullup resistance 52B is connected directly to a transistor 93B in a submergence detection circuit 9B without providing a switch in a first circuit 5B. In this case, when the transistor 93B turns on at the submerging of the vehicle in water, the pullup resistance 53B is regularly connected electrically to the signal line 51B. Thereby, since the voltage of the Lo signal to be outputted to a drive control circuit 22B is pulled up when the operation switch SW10B is operated, it is difficult to maintain the voltage level of the Lo signal to be low, so that an erroneous operation of making the elevation impossible is possibly generated.

On the other hand, as shown in FIG. 1 in the embodiment, since the switches 53, 73 are provided, only in a case where the operation switches SW1, SW2 are not operated, the pullup resistances 52, 72 are connected electrically to the signal lines 51, 71. Therefore, it is possible to maintain the voltage level of the Lo signal to be outputted when the operation switches SW1, SW2 are operated to be low.

In addition, in the comparative example 2 shown in FIG. 4, since the pullup resistance 52B is regularly connected to the signal line 51B, a time for a difference in potential between contact points of the operation switch SW10B to be generated becomes long, which possibly increases a corrosion speed of the contact point in the operation switch SW10B. Therefore, there is a possibility that even in a case where the pullup resistance 52B is provided, a time of being capable of maintaining the voltage level of the Hi signal becomes short to cause an erroneous operation of the window or a time of being capable of operating the window by the user at the submerging of the vehicle in water becomes short.

In the embodiment, since the pullup resistances 52, 57 are not regularly connected in this configuration shown in FIG. 1, it is possible to shorten the time for the difference in potential between the contact points C1,C2 to be generated and decrease the corrosion speed of the operation switches Sw1, SW2. Therefore, the erroneous operation of the window W can be prevented at the submerging of the vehicle in water to ensure the time for the user to operate the window W.

Further, in the comparative example 2 shown FIG. 4, since the current flows in the operation switch SW10B-side via the pullup resistance 52B, it is necessary to make a resistance value of the pullup resistance 52B large for protection of the operation switch SW10B. When the resistance value of the pullup resistance 52B is made large, it is difficult to maintain the voltage level of the Hi signal to be high.

In the embodiment, since the pullup resistances 52, 72 are not regularly connected, the time when the current flows in each of the operation switches SW1, SW2 can be shortened to suppress the resistance values of the pullup resistances 52, 72 to be low. Because of this, it is possible to maintain the voltage level of the Hi signal at the time of connecting the pullup resistances 52, 72 to be high. In addition, the pullup by the low resistance by connecting the vehicle power source and the pullup resistances 52, 72 with the MOSFETS 56, 76 having a small voltage drop can be made to maintain the voltage level of the Hi signal to be high.

As described above, the power window device 1 (the opening/closing body control device) according to the embodiment comprises:

(1) the motor 21 (the actuator) that elevates (opens/closes) the window W (the opening/closing body) of the vehicle;

the drive device 2 that drives the motor 21;

the operation switches SW1, SW2 that are operated at the elevating of the window W; and the signal output device 3 that drives the motor 21 by outputting the Lo signal (the signal of the voltage level below the threshold value TH) to the drive device 2 when the operation switches SW1, SW2 are operated, wherein the signal output device 3 includes:

the signal lines 51, 71 that connect the operation switches SW1, SW2 and the drive device 2 and output the signal to the drive device 2 in response to the operations of the operation switches SW1, SW2;

the submergence detection circuit 9 that detects submergence of the vehicle in water;

the switches 53, 73 that turn on in a case where the submergence of the vehicle in water is detected and the operation switches SW1, SW2 are not operated; and the pullup resistances 52, 72 that are connected via the switches 53, 73 to the vehicle power source (the power source), the pullup resistances 52, 72 being electrically connected to the signal lines 51, 71 when the switches 53, 73 turn on, to output the Hi signal (the signal the voltage level of which is equal to or more than the threshold value TH) to the drive device 2.

When the circuit component is wet because of the submerging of the vehicle in water, in some cases the Lo signal is outputted regardless of no operation of the operation switches SW1, SW2, which possibly causes the window W to perform the erroneous operation.

According to the embodiment, at the submerging of the vehicle in water and at the time the operation switches SW1, SW2 are not operated, the pullup resistances 52, 72 are connected electrically to the signal lines 51, 71 to output the Hi signal to the drive device 2, thereby making it possible to prevent the erroneous operation of the window W.

In addition, at the submerging of the vehicle in water the pullup resistances 52, 72 are not regularly connected to the signal lines 51, 71 and only in a case where the operation switches SW1, SW2 are not operated, the pullup resistances 52, 72 are caused to be connected electrically to the signal lines 51, 71. Thereby, the time when the difference in potential is generated is shortened, making it possible to decrease the corrosion speed of the contact points C1, C2 or the like in the operation switches SW1, SW2. Therefore, it is possible to ensure the time for the user to operate the window W at the submerging of the vehicle in water, thus making it possible to improve the safety of the vehicle.

Further, as the comparative example 2 shown in FIG. 4, in a case where the pullup resistance 52B is regularly connected, it is necessary to make the resistance value of the pullup resistance 52B large for the protection of the operation switch SW10B, but in the embodiment, as shown in FIG. 1, since the pullup resistances 52, 72 are not regularly connected, it is possible to suppress the resistance values of the pullup resistances 52, 72 to be low. Thereby, the voltage level of the Hi signal at the time of connecting the pullup resistances 52, 72 can be maintained to be high to appropriately prevent the erroneous operation of the window W.

(2) The switches 53, 73 are provided with:

the transistors 55, 75 (a first transistor) connected to the submergence detection circuit 9; and the MOSFETS 56, 76 (a second transistor) that are connected to the transistors 55, 75 to connect the pullup resistances 52, 72 and the vehicle power source, wherein the operation switches SW1, SW2 are connected to be branched in the connection between the submergence detection circuit 9 and the transistors 55, 75, and the transistors 55, 75 drive the MOSFETS 56, 76 in a case where the submergence of the vehicle in water is detected and the operation switches SW1, SW2 are not operated, thereby electrically connecting the pullup resistances 52, 72 and the vehicle power source.

The switches 53, 73 are configured of the transistors 55, 75 that turn on in response to the states of the submergence detection circuit 9 and the operation switches SW1, SW2, and the MOSFETS 56, 76 that are driven by the turning-on of the transistors 55, 75 to switch the electrical connection and disconnection between the vehicle power source and the pullup resistances 52, 72. Thereby, at the submerging of the vehicle in water, the switching of the connection and the disconnection of the pullup resistances 52, 57 to the signal lines 51, 71 can be appropriately performed in response to the states of the operation switches SW1, SW2.

In addition, the pullup by the low resistance by connecting the vehicle power source and the pullup resistances 52, 72 with the MOSFETS 56, 76 having a small voltage drop can be made to maintain the voltage level of the Hi signal to be high. Thereby, the erroneous operation of the window W at the submerging of the vehicle in water can be prevented.

In the aforementioned embodiment, an explanation is made of the power window device 1 provided in the window W of the single side door, but the present invention is not limited thereto, and a device as similar to the above configuration may be provided in the window W of each of side doors in the vehicle. In this case, the submergence detection circuit 9 may be provided with a separate circuit as a common circuit to the plurality of power window devices 1, or the submergence detection circuits 9 may be provided respectively to the forward side doors and to the backward side doors in the vehicle. An application of the opening/closing body control device in the present invention is not limited to the power window device 1, but the same configuration may be applied to a device opening/closing a sunroof as another opening/closing body, for example.

In the aforementioned embodiment, the MOSFETS 56, 76 as the second transistor connecting the vehicle power source and the pullup resistances 52, 72 are used in the switches 53, 73, but the present invention is not limited thereto. A pnp transistor may be used as the second transistor in accordance with the voltage required for the pullup of the Hi signal to be outputted at the submerging of the vehicle in water. In a case of using the pnp transistor, the base side may be connected to the collector sides of the transistors 55, 75, the emitter side may be connected to the vehicle power source, and the collector side may be connected via the diodes 54, 74 to the pullup resistances 52, 72.

The embodiments and the modifications of the present invention are described thus far, but the present invention is not limited to the embodiments and the modifications, and can be changed as needed within the range of the technical concept of the invention.

What is claimed is:

1. An opening/closing body control device comprising:
   an actuator configured to at least one of open and close an opening/closing body of a vehicle;
   a drive device configured to drive the actuator;
   an operation switch that is operated at the at least one of opening and closing of the opening/closing body; and
   a signal output device configured to drive the actuator via outputting a signal of a voltage level below a threshold value to the drive device when the operation switch is operated;
   wherein the signal output device includes:
      a signal line connecting the operation switch and the drive device to output the signal to the drive device when the operation switch is operated;
      a submergence detection circuit configured to detect submergence of the vehicle in water;
      a switch configured to turn on when submergence of the vehicle in water is detected and the operation switch is not operated; and
      a pullup resistance that is connected via the switch to a power source, the pullup resistance connected electrically to the signal line when the switch turns on to output a signal, a voltage level of which is equal to or greater than the threshold value, to the drive device.

2. The opening/closing body control device according to claim 1, wherein:
   the switch includes:
      a first transistor connected to the submergence detection circuit via a connection; and
      a second transistor that is connected to the first transistor to connect the pullup resistance and the power source;
   the operation switch is connected to the connection between the submergence detection circuit and the first transistor; and
   the first transistor electrically connects the pullup resistance and the power source via driving the second transistor when submergence of the vehicle in water is detected and the operation switch is not operated.

3. The opening/closing body control device according to claim 2, wherein the second transistor includes a metal-oxide-semiconductor field-effect transistor.

* * * * *